United States Patent
Schaffer et al.

(10) Patent No.: US 9,654,092 B1
(45) Date of Patent: May 16, 2017

(54) HIGH SPEED GAIN STAGE WITH ANALOG INPUT AND DETERMINABLE DIGITAL OUTPUT USING REGENERATIVE FEEDBACK

(71) Applicant: XCELSEM, LLC, Santa Clara, CA (US)

(72) Inventors: Gregory L Schaffer, Cupertino, CA (US); Maarten J Fonderie, Santa Clara, CA (US)

(73) Assignee: XCELSEM, LLC, Santa Clara, CA (US)

( * ) Notice: Subject to any disclaimer, the term of this patent is extended or adjusted under 35 U.S.C. 154(b) by 0 days.

(21) Appl. No.: 15/230,744

(22) Filed: Aug. 8, 2016

(51) Int. Cl.
G11C 7/00 (2006.01)
H03K 5/24 (2006.01)
H03K 5/08 (2006.01)
H03K 19/0185 (2006.01)

(52) U.S. Cl.
CPC ............ *H03K 5/2481* (2013.01); *H03K 5/08* (2013.01); *H03K 19/018514* (2013.01)

(58) Field of Classification Search
CPC . H03K 5/2481; H03K 19/018514; H03K 5/08
USPC .......................................................... 327/55
See application file for complete search history.

(56) References Cited

U.S. PATENT DOCUMENTS

| | | | | |
|---|---|---|---|---|
| 5,294,847 A * | 3/1994 | Grossman | ............... | G11C 7/065 327/215 |
| 5,504,443 A * | 4/1996 | Gross | ..................... | G11C 7/065 327/185 |
| 7,187,207 B2 * | 3/2007 | Rowley | ............ | H03K 3/356139 326/112 |
| 8,030,972 B2 * | 10/2011 | Jansson | .............. | H03K 3/35613 327/215 |

OTHER PUBLICATIONS

Baker, R. Jacob. "CMOS: Circuit Design, Layout, and Simulation." $2^{nd}$ Edition. IEEE Press Series on Microelectronics Systems. pp. 909-913. Nov. 9, 2007.

* cited by examiner

*Primary Examiner* — Kenneth B Wells
(74) *Attorney, Agent, or Firm* — Gary Stanford; Huffman Law Group, PC

(57) ABSTRACT

A high speed gain stage including regenerative feedback that forces one output high and one output low providing a two-state output. A differential pair of input transistors of a first conductivity type have respective current terminals coupled between a source node and first and second output nodes and have respective control terminals that receive the analog input voltages. A current source provides source current to the source node. The gain stage includes a differential pair of bias transistors of a second conductivity type having respective current terminals coupled between the first and second output nodes and a reference voltage and having respective control terminals coupled to a bias node. A pair of current-driven transistors of the second conductivity type are cross-coupled at the outputs and to a common node to provide the regenerative feedback. Another transistor is coupled between the common node and the reference voltage to increase switching speed.

20 Claims, 3 Drawing Sheets

HIGH SPEED GAIN STAGE WITH ANALOG INPUT AND DETERMINABLE DIGITAL OUTPUT USING REGENERATIVE FEEDBACK

BACKGROUND OF THE INVENTION

Field of the Invention

The present invention relates in general to gain stages, and more particularly to a high speed gain stage having an analog input, high gain, and a determinable differential digital output using regenerative feedback.

Description of the Related Art

A low power precision analog comparator may be implemented using multiple gain stages. One or more input stages remove any common mode voltage and amplify a voltage difference between a pair of analog input voltages. A subsequent comparator gain stage compares the analog output voltages from the input stage(s) and outputs a corresponding differential pair of digital voltages. The differential pair of digital voltages should only have two opposite states, including a first state in which a first polarity is high while the second polarity is low, and a second state in which the first polarity is low while the second polarity is high. Additional stages may be included depending upon the desired digital output.

The comparator gain stage may be implemented as a conventional linear gain stage. A conventional linear gain stage, however, supplies digital output signals that can both be low, high, or somewhere in-between thus violating the requisite two-state digital output. In the conventional configuration, a small differential analog input may cause the conventional gain stage to provide an output that is proportional to the differential analog input, such that the outputs are analog rather than digital. Also, if the offset voltages of internal amplifiers are not the same, it is possible to have a differential voltage in which both outputs are either high or low. Any of these indeterminate digital output states cause at least two problems. First, the output(s) of downstream digital logic may be indeterminate. Second, the supply current of the circuitry can increase and even become excessive. It is desired that the differential pair of digital signals be well defined to prevent issues with down stream circuitry.

SUMMARY OF THE INVENTION

A high speed gain stage implemented according to one embodiment includes a pair of current-driven transistors cross-coupled at the outputs to provide positive feedback that forces one output high and one output low thus meeting the desired two-state output. The gain stage includes a differential pair of input transistors of a first conductivity type having respective current terminals coupled between a source node and first and second output nodes and having respective control terminals that receive the analog input voltages. A current source coupled to a digital supply voltage provides source current to the source node. The gain stage includes a differential pair of bias transistors of a second conductivity type having respective current terminals coupled between the first and second output nodes and a reference supply voltage and having respective control terminals coupled to a bias node having a bias voltage. A bias circuit establishes the bias voltage for the pair of bias transistors to establish bias currents through the gain stage in a current-mirrored configuration.

The cross-coupled transistors include a first transistor of the second conductivity type having current terminals coupled between the second output node and a common node and having a control terminal coupled to the first output node, and a second transistor of the second conductivity type having current terminals coupled between the first output node and the common node and having a control terminal coupled to the second output node. Another transistor of the second conductivity type has current terminals coupled between the common node and the reference supply voltage, and has a control terminal coupled to the bias node.

The differential pair of input transistors may match each other, the differential pair of bias transistors may match each other, and the cross-coupled transistors may also match each other for a symmetrical configuration. The current-driven, cross-coupled transistors collectively provide regenerative feedback forcing one of the first and second output nodes towards the digital supply voltage while forcing the other one of output node towards the reference supply voltage. The differential pair of bias transistors may further include cascode transistors in a cascode configuration. A clamp circuit may be provided to limit the output nodes of the gain stage to a limit voltage level that prevents the differential pair of input transistors from entering a linear operating mode.

The gain stage may be used as the comparator gain stage of an analog comparator. The comparator has an input amplifier coupled between an analog supply voltage and the reference supply voltage and operates to amplify a difference between first and second analog input voltages to provide first and second analog output voltages to the input of the comparator gain stage. The input amplifier may remove a common mode voltage of the analog input voltages. The comparator may further include a clamp circuit that limits the output voltage of the comparator gain stage, a level translator that translates the limited voltage of the comparator gain stage output to a desired digital voltage level, and a logic circuit that converts the digital output to a pair of drive signals to drive a complementary pair of MOS transistors providing a singular digital output.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized problems with conventional gain stages that do not provide a determinable digital output based on an analog input. In an exemplary and non-limiting application, a gain stage is provided within an analog comparator that receives an analog input and that provides a digital output. The analog input is in the form of first and second analog voltages, where the digital output is intended to indicate which of the analog voltages has a greater magnitude. An input amplifier removes the common mode voltage and amplifies the voltage difference of the analog input signals. It is desired to provide a gain stage that converts the analog input voltages to a determinable two-state differential digital output that reflects the voltage level of the first analog input voltage relative to the second. Despite the symmetrical form of a conventional gain stage, it often asserted both output polarities high, low, or at some intermediate voltage level thus not meeting the desired two-state output.

The inventors have therefore developed a high speed gain stage according to embodiments of the present invention that uses regenerative feedback and provides a determinable digital output. A pair of current driven transistors cross-coupled at the outputs of the gain stage provides positive feedback, otherwise referred to as regenerative feedback, that forces one output high and one output low thus meeting the desired two-state output. The two-state output may be used directly or may be further conditioned and/or converted to a desired digital form. Although the gain stage is described in the context of an analog comparator, it may be used in other applications in which it is desired to compare a pair of analog input voltages and provide a two-state digital output.

Figure 1:
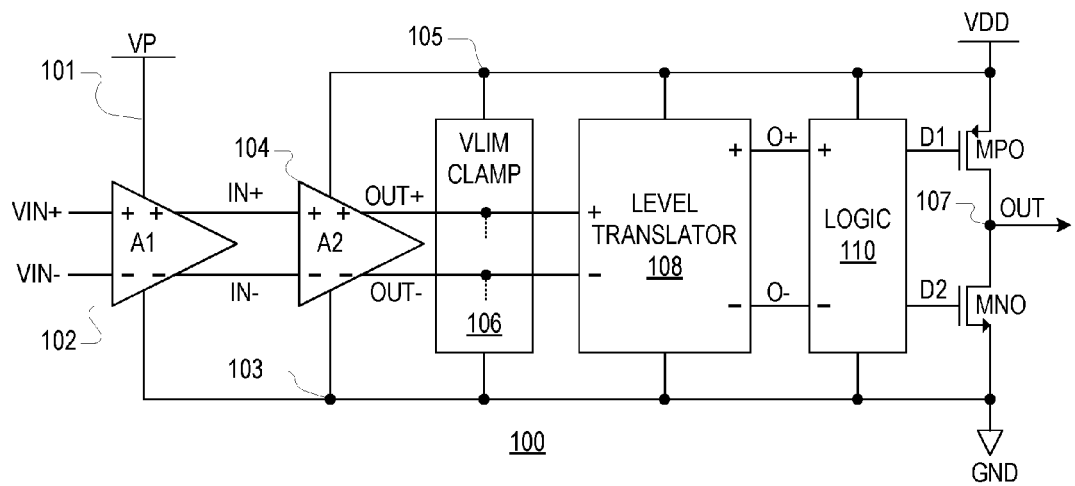
FIG. 1 is a schematic and block diagram of a low power precision analog comparator including a gain stage implemented according to an embodiment of the present invention.

FIG. 1 is a schematic and block diagram of a low power precision analog comparator 100 including a gain stage 104 implemented according to an embodiment of the present invention. In general, the comparator 100 receives an analog input voltage VIN having a positive polarity VIN+ and a negative polarity VIN− and provides a digital output signal OUT. The comparator 100 includes an input amplifier 102, the gain stage 104, a clamp circuit 106, a level translator 108, a logic circuit 110, and an output circuit including a complementary pair of MOS transistors (CMOS) including a P-channel transistor MPO and an N-channel transistor MNO. In general, the input amplifier 102 amplifies the voltage difference between VIN+ and VIN−, the gain stage 104 performs a comparator function that identifies the larger of VIN+ and VIN−, the clamp circuit 106 limits the output voltage of the gain stage 104 as further described herein, the level translator 108 translates the voltage range at the output of the clamp circuit 106 to a larger digital output voltage range, and the logic circuit 110 drives MPO and MNO to develop the digital output signal OUT.

Each transistor described herein, including MPO and MNO, may be implemented with one or more MOS (metal-oxide semiconductor), FET (field-effect transistor), or MOSFET devices, in which the current terminals are the drain and source terminals and the control terminal is the gate terminal. References to "P-channel" and "N-channel" distinguish between different conductivity types, in which the conductivity types may include P-type or N-type or the like.

The input amplifier 102 includes an upper supply terminal coupled to a voltage supply node 101 receiving an analog supply voltage VP, and includes a lower supply terminal coupled to a voltage supply node 103 developing a reference supply voltage. In the illustrated configuration, the reference supply voltage is shown as ground (GND), although any positive, negative or zero voltage level is contemplated. The gain stage 104, the clamp circuit 106, the level translator 108, and the logic circuit 110 each include an upper supply terminal coupled to a voltage supply node 105 receiving a digital supply voltage VDD, and each includes a lower supply terminal coupled to GND. MPO has a source terminal coupled to VDD, a gate terminal receiving a first drive signal D1 provided by the logic circuit 110, and a drain terminal coupled to an output node 107 developing a digital output voltage OUT. MNO has a source terminal coupled to GND, a gate terminal receiving a second drive signal D2 provided by the logic circuit 110, and a drain terminal coupled to the output node 107.

The input amplifier 102 has a differential input including a positive polarity input receiving the positive polarity input voltage VIN+ and a negative polarity input receiving the negative polarity input voltage VIN−. The input amplifier 102 has a differential output including a positive polarity output providing a positive polarity output voltage IN+ and a negative polarity output providing a negative polarity output voltage IN−. The gain stage 104 has a differential input including a positive polarity input receiving IN+ and a negative polarity input receiving IN−. The gain stage 104 has a differential output including a positive polarity output providing a positive polarity output voltage OUT+ and a negative polarity output providing a negative polarity output voltage OUT−. The clamp circuit 106 limits the voltages of OUT+ and OUT− to a limited voltage level VLIM relative to GND as further described herein. The level translator 108 has a differential input including a positive polarity input receiving OUT+ and a negative polarity input receiving OUT−. The level translator 108 has a differential digital output including a positive polarity output providing a positive polarity output voltage O+ and a negative polarity output providing a negative polarity output voltage O−. The logic circuit 110 converts the differential input signals O+/O− to the drive signals D1 and D2 for driving the gate terminals of MPO and MNO, respectively.

The analog input voltages VIN+ and VIN− swing anywhere from GND to VP and may have a relatively large common mode voltage. In one embodiment, VP has a voltage level of 1.5 Volts (V) to 45V depending upon the expected voltage range of VIN+ and VIN−. The input amplifier 102 removes the common mode voltage of the differential analog input voltage VIN+/VIN− and amplifies the result to develop IN+ and IN−. In one embodiment, IN+ and IN− each swing from GND to 0.3V. The gain stage 104 asserts the differential outputs OUT+ and OUT− as digital signals in which one is high and one is low depending upon the relative level of IN+ to IN−. Since the gain stage 104 is referenced between VDD and GND, OUT+ and OUT− may each switch between GND and VDD. The clamp circuit 106, however, limits the maximum voltage level of OUT+ and OUT− to VLIM which is below the voltage level of SRC. In one embodiment, VDD has a voltage level of 1.2 Volts (V) to 5V and OUT+ and OUT− each switch between 0V (GND) and 1V depending upon the configuration. The level translator 108 translates the lower voltage levels of OUT+/OUT− to the higher voltage level of VDD (i.e., GND to VDD). The logic circuit 110 asserts D1 and D2 to reflect the digital state of O+/O−. For example, when O+ is high and O− is low, D1 and D2 are both asserted low turning MPO on and turning MNO off to drive OUT high to VDD. When O+ is low and O− is high, D1 and D2 are both asserted high turning MPO off and turning MNO on to drive OUT low to GND.

In general, when VIN+ is greater than VIN−, the gain stage 104 asserts OUT+ high and OUT− low so that OUT is driven high to VDD. When VIN+ is less than VIN−, the gain stage 104 asserts OUT+ low and OUT− high so that OUT is driven low to GND. If VDD is sufficiently low, the clamp circuit 106 and the level translator 108 may be eliminated so that OUT+ and OUT− are directly provided to the inputs of the logic circuit 110. In this case, the characteristics of the input devices of the logic circuit 110 may be adjusted to complement the characteristics of the output devices of the gain stage 104 to maximize speed and performance. If included, the clamp circuit 106 may be incorporated into the output of the gain stage 104. The input amplifier 102, the level translator 108, and the logic circuit 110 are not further described.

Figure 2:
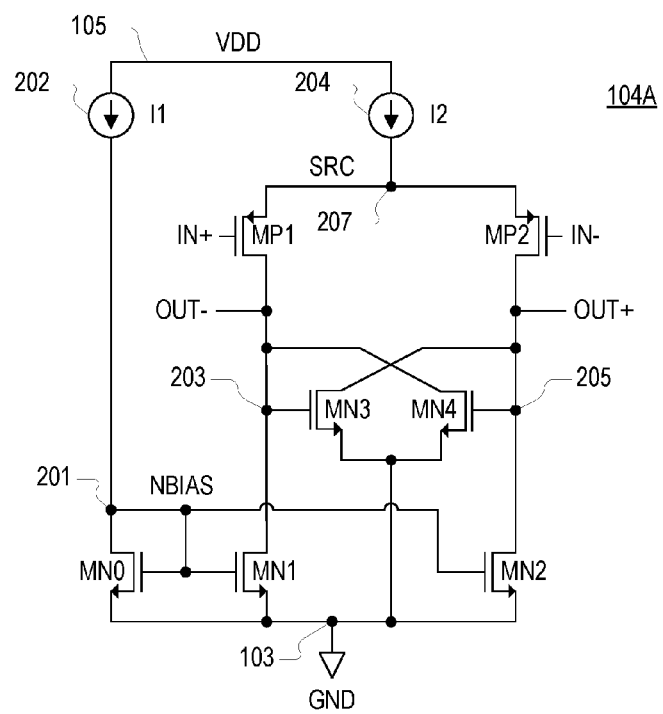
FIG. 2 is a schematic diagram of a gain stage according to one embodiment of the present invention which may be used as the gain stage of the comparator of FIG. 1.

FIG. 2 is a schematic diagram of a gain stage 104A implemented according to one embodiment of the present invention that may be used as the gain stage 104 of the comparator 100. A current source 202 has an input coupled to the voltage supply node 105 (VDD) and an output sourcing a current I1 to a bias node 201 that develops a bias voltage NBIAS for N-type devices. An N-channel transistor MN0 has its drain and gate terminals coupled to the bias node 201 and its source terminal coupled to the reference node 103 (GND). Another pair of N-channel transistors MN1 and MN2 each has its gate terminal coupled to the bias node 201 (NBIAS) and its source terminal coupled to GND. The drain terminal of MN1 is coupled to a negative polarity output node 203 developing the negative polarity output voltage OUT−. The drain terminal of MN2 is coupled to a positive polarity output node 205 developing the positive polarity output voltage OUT+. In this manner, MN1 and MN2 are each coupled in a current mirror configuration with MN0 so that each develops a drain current of I1.

Another current source 204 has an input coupled to VDD and an output providing a current I2 to an upper source (SRC) node 207. A P-channel transistor MP1 has its source terminal coupled to the source node 207, its drain terminal coupled to the negative polarity output node 203 (OUT−), and its gate terminal receiving the positive polarity input voltage IN+. Another P-channel transistor MP2 has its source terminal coupled to the source node 207, its drain terminal coupled to the positive polarity output node 205 (OUT+), and its gate terminal receiving the negative polarity input voltage IN−. In this manner, each of the pair of transistors MP1/MN1 and MP2/MN2 are coupled in complementary manner between the source node 207 and the reference node 103.

A pair of cross-coupled N-channel transistors MN3 and MN4 are provided and coupled between the output nodes and GND. As shown, MN3 has its drain terminal coupled to OUT+, its gate terminal coupled to OUT−, and its source terminal coupled to GND. In similar manner, MN4 has its drain terminal coupled to OUT−, its gate terminal coupled to OUT+, and its source terminal coupled to GND. As described further herein, the cross-coupled configuration of MN3 and MN4 provide regenerative feedback (otherwise referred to as positive feedback) that ensures a proper digital state of the differential output voltage OUT+/OUT− in response to the differential input voltage IN+/IN−.

MP1, MP2, MN1 and MN2 may be coupled in a symmetrical configuration assuming that MP1 and MP2 are matched with each other and that MN1 and MN2 are also matched with each other. MN0 is set up in the same mirror configuration with both MN1 and MN2 and thus establishes the same branch current I1. In one embodiment, I1=I2/2 so that the drain currents of MN1 and MN2 both equal I2/2. In operation, and temporarily ignoring MN3 and MN4, if IN+=IN−, then ideally MP1 and MP2 both have drain currents of I2/2. Assuming MP1 and MP2 are matched, this results in identical output voltages for OUT+ and OUT− so that neither output polarity is at GND or at the SRC voltage (in which the SRC voltage approaches VDD if operation of the clamp circuit 106 is ignored). If the outputs are both the same, the desired two-state digital output, in which one polarity is high while the other is low, is not achieved. Also, since the offset voltages of MP1 and MP2 in general do not match the offset voltages of MN1 and MN2, it is possible that both output polarities go high or both go low, which again does not achieve the desired two-state output.

The regenerative feedback configuration forces either MN3 or MN4 to turn on while the other is turned off to prevent an undesired output. For example, if OUT+ is slightly more positive than OUT−, then the drain current of MN4 is greater than the drain current of MN3 which has the effect of pulling OUT− more negative while, due to the weaker current of MN3, pulling OUT+ more positive. This, in turn, causes the drain current of MN4 to get stronger while causing the drain current of MN3 to get weaker. Ultimately, MN4 pulls OUT− to GND while OUT+ goes high to the clamped voltage level VLIM. The opposite is true when OUT− is slightly more positive then OUT+, in which MN3 pulls OUT+ to GND while OUT− is driven to VLIM.

In one embodiment, MN0, MN1 and MN2 match each other while MN3 and MN4 match each other, although MN3/MN4 do not match MN0/MN1/MN2. Instead, MN3 and MN4 are kept as small as reasonably possible to minimize their gate capacitance loading of the output nodes OUT+ and OUT−. If MN3 and MN4 were not provided, MN1 and MN2 generally have the same drain current as MP1 and MP2 when IN+=IN−, and if the currents are chosen to be equal on top and bottom, any mismatch may make the bottom currents (slightly) larger, resulting in both outputs being low at the same time. This is undesirable since the desired two-state differential digital output is not achieved.

The inclusion of MN3 and MN4 provide the correct output results. In equilibrium for identical input voltages, some of the drain currents of MP1 and MP2 flow into MN1 and MN2, respectively. Some of the drain currents also flow into MN3 and MN4 which causes them to force one output high and the other output low, which thus satisfies the two-state digital output requirement. It may also be desired to prevent high supply current in the level translator 108. In one embodiment, MN3 and MN4 also match the input transistors of the level translator 108. Since MN3 and MN4 have weak currents at equilibrium, so do the input devices of the level translator 108, which prevents high supply current.

If the clamp circuit 106 were not provided, then the gain stage 104 would drive each polarity of its differential output, OUT+ and OUT−, between GND and VDD (or very close to VDD). If the voltage level of VDD is sufficiently high, then MP1 and MP2 are each essentially driven into their linear mode of operation, which significantly increases the capacitance at the output nodes 203 and 205. The output polarities OUT+ and OUT− still transition to the proper digital states. The increase of capacitance at the output, however, slows the speed of transition for OUT+ and OUT− and thus reduces overall performance. The clamp circuit 106 clamps the maximum voltage of OUT+ and OUT− to VLIM, in which VLIM is selected at a level that prevents MP1 and MP2 from entering their linear operating modes to ensure fast switching of OUT+ and OUT− between GND and VLIM. In one embodiment, VLIM is 1V, although any other voltage level that prevents MP1 and MP2 from their linear operating modes is contemplated.

It is noted that if VDD is sufficiently low such that MP1 and MP2 do not enter their linear operating mode when OUT+ and OUT− switch between GND and VDD, then the clamp circuit 106 and the level translator 108 may be eliminated. In this case, the output devices of the gain stage 104 are configured to complement the input devices of the logic circuit 110 for optimal operation. In an alternative embodiment, the upper supply terminal of the gain stage 104 may be coupled to a lower supply voltage that is less than VDD. It is noted, however, that this further complicates the circuit and may not prevent MP1 and MP2 from entering their linear operating modes. A separate lower voltage supply for the gain stage 104 may thus not achieve optimal operation.

The addition of the clamp circuit 106 enables VDD to be provided at a suitable level for logic circuitry coupled at the output of the comparator and driven by the output transistors MPO and MNO. In one embodiment, for example, VDD is 5V. Furthermore, the clamp circuit 106 limits the maximum voltage exposure of the transistors of the gain stage 104, so that smaller and faster transistor devices may be used. The use of smaller and faster transistors speeds up switching transitions thus improving overall performance.

Figure 3:
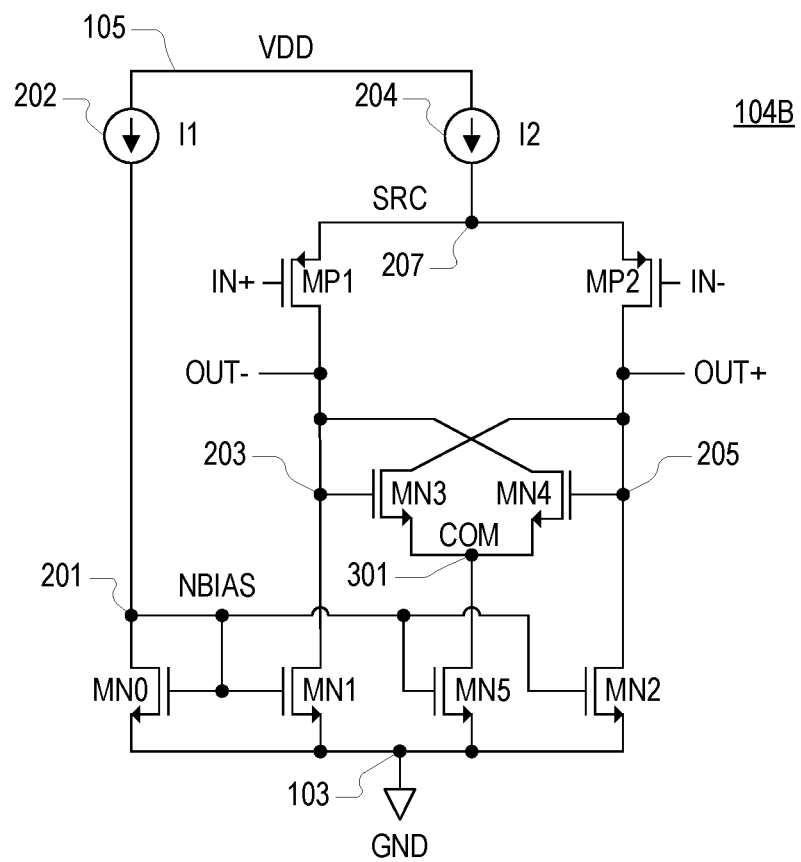
FIG. 3 is a schematic diagram of a high speed gain stage according to another embodiment of the present invention which may also be used as the gain stage of the comparator of FIG. 1.

FIG. 3 is a schematic diagram of a high speed gain stage 104B according to another embodiment of the present invention that may also be used as the gain stage 104 of the comparator 100. The gain stage 104B is similar to the gain stage 104A in which similar components assume identical reference numbers, but is configured for higher speed operation. The current sources 202 and 204, the P-channel transistors MP1 and MP2 and the N-channel transistors MN1-MN2 are coupled to the nodes 103, 105, 201, 203, 205, and 207 in the same manner to operate in a substantially similar manner. MN3 and MN4 are also included having their drain and gate terminals cross-coupled to the output nodes 203 and 205 in the same manner. The source terminals of MN3 and MN4, however, are coupled instead to a common (COM) node 301. An additional N-channel transistor MN5 has its drain terminal coupled to COM node 301, its gate terminal coupled to NBIAS, and its source terminal coupled to GND.

MN5 is provided to drive the source terminals of MN3 and MN4, which is used to limit the amount of regenerative feedback to produce a faster response as compared to the gain stage 104A. As shown by the gain stage 104A, if OUT+ is at VLIM and OUT− is at GND, then MN4 is turned on. When the input differential signal IN+/IN− changes polarity, MP1 cannot overpower MN4, so that the circuit has to wait until MN2 pulls OUT+ sufficiently low so that OUT− can begin to rise. When MN5 is included, however, the current of MN4 is limited by MN5. Assuming the same scenario in which MP1 turns on and MP2 turns off, MP1 easily overpowers MN4 and thus pulls OUT− high while OUT+ is being pulled low by MN2 and MN3 (assuming that the current of MN5 is the same or less that that of MN1 and MN2).

Figure 4:
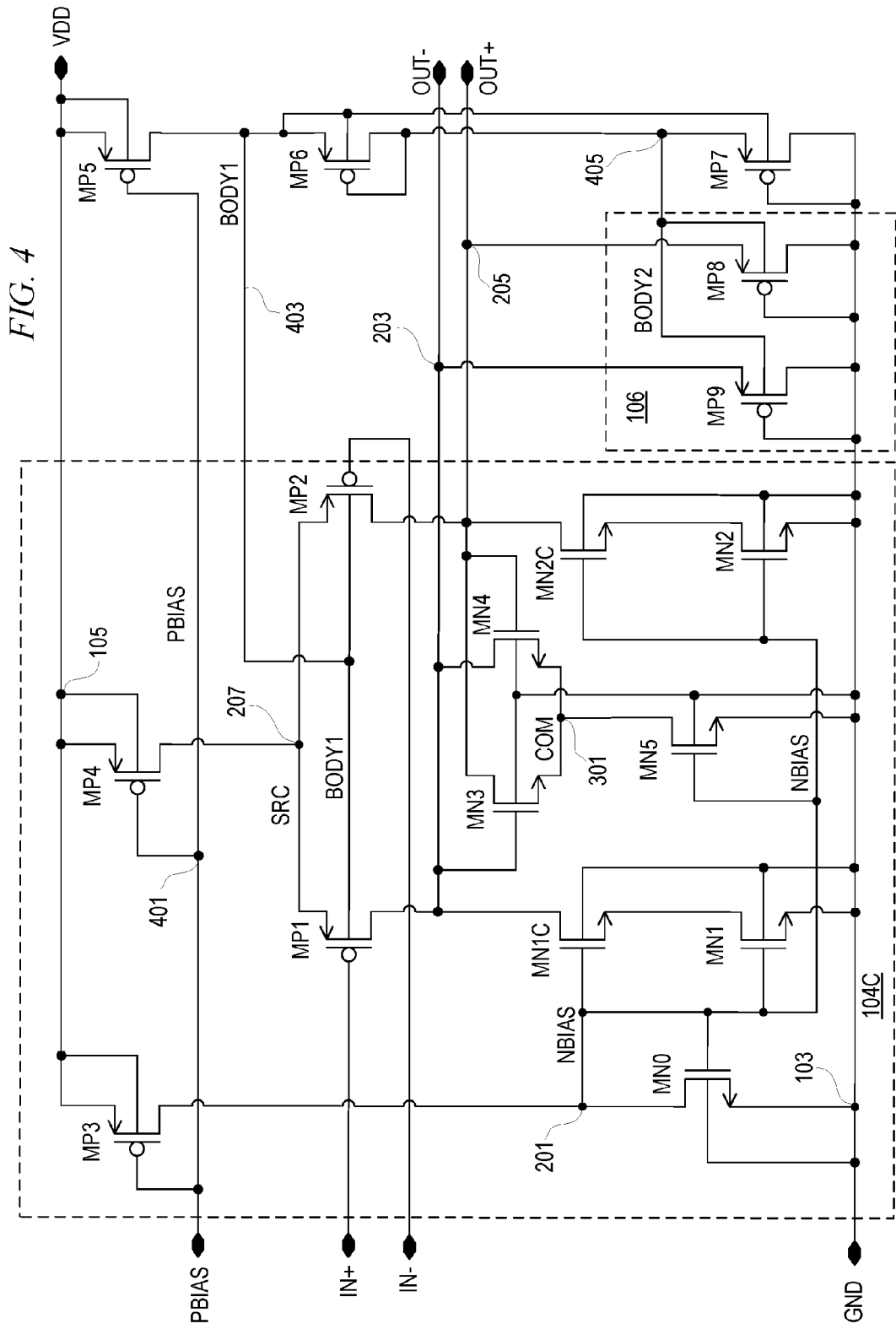
FIG. 4 is a schematic diagram of a high speed gain stage according to yet another embodiment of the present invention which may be used as the gain stage of the comparator of FIG. 1.

FIG. 4 is a schematic diagram of a high speed gain stage 104C according to yet another embodiment of the present invention that may be used as the gain stage 104 of the comparator 100. Also shown is a configuration of the clamp circuit 106 implemented according to one embodiment. The gain stage 104C is configured in a similar manner as the gain stage 104B with similar components having the same reference numbers and coupled in similar manner. MP1 and MP2 are coupled in similar manner, each having its source terminal coupled to the source node 207 (SRC). The gate terminal of MP1 receives IN+ and its drain terminal is coupled to the output node 203 providing the negative output polarity voltage OUT−. The gate terminal of MP2 receives IN− and its drain terminal is coupled to the output node 205 providing the positive output polarity voltage OUT+. MNO has its drain and gate terminals coupled to the bias node 201 and has its source terminal coupled to the reference node 103 in a similar manner. MN3, MN4 and MN5 each have their drain, source and gate terminals coupled in the same manner as described for the gain stage 104B. In particular, the drain, gate and source terminals of MN3 are coupled to OUT+, OUT−, and COM (node 301), respectively, and the drain, gate and source terminals of MN4 are coupled to OUT−, OUT+, and COM, respectively. The drain, gate and source terminals of MN5 are coupled to COM, NBIAS, and GND, respectively.

MN1 and MN2 are coupled in similar manner except including a cascode configuration with N-channel cascode transistors MN1C and MN2C, respectively. The drain terminal of MN1C is coupled to OUT−, its gate terminal is coupled to NBIAS, and its source terminal is coupled to the drain terminal of MN1. The drain terminal of MN2C is coupled to OUT+, its gate terminal is coupled to NBIAS, and its source terminal is coupled to the drain terminal of MN2. The gate terminals of MN1 and MN2 are coupled to NBIAS, and the source terminals of MN1 and MN2 are coupled to GND. The cascode configurations of MN1/MN1C and MN2/MN2C increases DC gain and minimizes capacitor loading from MN1 and MN2 to the outputs OUT+/OUT−.

The current sources 202 and 204 are implemented with P-channel transistors MP3 and MP4, respectively. MP3 and MP4 both have their source terminals coupled to VDD and their gate terminals coupled to a bias node 401 that receives a bias voltage PBIAS for P-type devices. PBIAS may be developed in a similar manner as NBIAS but with the correct voltage level to bias MP3, MP4 and another P-channel transistor MP5. The drain terminal of MP3 is coupled to NBIAS and the drain terminal of MP4 is coupled to the source node 207. MP5 has its source and gate terminals coupled to VDD and PBIAS, respectively, in similar manner. The drain terminal of MP5 is coupled to a body node 403 developing a body voltage BODY1. Another pair of P-channel transistors MP6 and MP7 are each diode-coupled between node 403 (BODY1) and GND. As shown, MP6 has its source terminal coupled to node 403 and its gate and drain terminals coupled together at another body node 405 developing another body voltage BODY2. MP7 has its source terminal coupled to the body node 405 and its gate and drain terminals coupled together at GND.

Each of the transistors of the gain stage 104C are shown with body connections. The body connections of MP3, MP4 and MP5 are coupled to VDD. The body connections of MP1, MP2, MP6, and MP7 are coupled to the body node 403 (BODY1). The body connections of each of the N-channel transistors MN0-MN5, MN1C and MN2C are coupled to GND. It is noted that the body connections of MP1 and MP2 could be tied to their source terminals, but this adds extra capacitance to the output polarities OUT+/OUT− which slows output response. Instead, the body connections of MP1 and MP2 are coupled to BODY1 having a voltage established by the series connections of MP5, MP6 and MP7 (MP5 biases MP6 and MP7). This also allows the threshold voltages of MP1 and MP2 to be increased because of back-gate biasing, which results in a wider swing of the output voltage polarities OUT+/OUT−.

The clamp circuit 106 is shown implemented with another pair of P-channel transistors MP8 and MP9. MP8 and MP9 are each diode-coupled having their gate and drain terminals coupled to GND. The source terminal of MP8 is coupled to OUT+ and the source terminal of MP9 is coupled to OUT−. The body connections of MP8 and MP9 of the clamp circuit 106 are coupled to the body node 405 (BODY2). It is noted that the body connections of MP8 and MP9 could be tied to their source terminals, but this adds extra capacitance to the output polarities OUT+/OUT− which slows output response. Instead, the body connections of MP8 and MP9 are coupled to BODY2 biased at the source terminal of MP7 (in the stacked configuration with MP5 and MP6).

In one embodiment, any one or more of the transistors may be implemented as a multiple number of transistors coupled in parallel to increase the relative amount of current through the transistor. For example, MP3 may be implemented as a single P-type transistor of a certain size (thus having a multiple of one or 1×), whereas MP4 is implemented with seven transistors of the same size as MP3 coupled in parallel (thus having a multiple of seven or 7×), so that MP4 sources 7 times the current of MP3. MNO may be implemented as a single N-type transistor of a certain size for sinking the current from MP3 and establishing a relative bias current level for MN1, MN2 and MN5. MN1 and MN2 are each implemented with three transistors coupled in parallel each having the same size as MNO, and MN5 is implemented as a single transistor having the same size as MNO. In this manner, MN1 and MN2 each nominally sink $3/7^{th}$ of the current from MP4 and MN5 nominally sinks $1/7^{th}$ of the total bias current from MP4. When the input voltages on IN+ and IN− are identical, and all transistors are perfectly matched, the bias current from MP4 nominally splits in half between MP1 and MP2, each developing 3.5/7 of the current from MP4. This leaves a nominal level of $1/7^{th}$ the bias current that flows through the feedback path formed by MN3, MN4 and MN5 for regenerative feedback. In this manner, MN1 and MN2 each have $6/7^{th}$ the current level of each of the P-channel transistors MP1 and MP2. Stated another way, MP4 sources 7× current, which is split in half as 3.5× each through MP1 and MP2, which is then split as 3× for each of MN1 and MN2 and 1× for MN5. The 1× current through MN5 flows through MN3 or MN4 depending upon which is turned on. Once the regenerative feedback forces OUT+ high and OUT− low, or vice-versa, the current levels through the transistors change from the equilibrium values described above.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A gain stage, comprising:
    a first current source having an input coupled to a digital supply voltage and having an output providing a first current level to a first bias node;
    a second current source having an input coupled to said digital supply voltage and having an output providing a second current level to a source node;
    a first transistor of a first conductivity type having current terminals coupled between said source node and a first output node, and having a control terminal coupled to a first input node;
    a second transistor of said first conductivity type having current terminals coupled between said source node and a second output node, and having a control terminal coupled to a second input node;
    a first transistor of a second conductivity type having current terminals coupled between said first bias node and a reference supply voltage, and having a control terminal coupled to said first bias node;
    a second transistor of said second conductivity type having current terminals coupled between said first output node and said reference supply voltage, and having a control terminal coupled to said first bias node;
    a third transistor of said second conductivity type having current terminals coupled between said second output node and said reference supply voltage, and having a control terminal coupled to said first bias node;
    a fourth transistor of said second conductivity type having current terminals coupled between said second output node and a common node, and having a control terminal coupled to said first output node;
    a fifth transistor of said second conductivity type having current terminals coupled between said first output node and said common node, and having a control terminal coupled to said second output node; and
    a sixth transistor of said second conductivity type having current terminals coupled between said common node and said reference supply voltage, and having a control terminal coupled to said first bias node.

2. The gain stage of claim 1, wherein said second current level is at least twice said first current level.

3. The gain stage of claim 1, wherein said first and second input nodes form positive and negative polarities, respectively, of a differential analog input voltage, and wherein said first and second output nodes form negative and positive polarities, respectively, of a differential digital output voltage.

4. The gain stage of claim 1, wherein said fourth and fifth transistors of said second conductivity type collectively provide regenerative feedback forcing one of said first and second output nodes towards a voltage of said digital supply voltage while forcing the other one of said first and second output nodes towards a voltage of said reference supply voltage.

5. The gain stage of claim 1, wherein said first and second transistors of said first conductivity type match each other, wherein said first, second and third transistors of said second conductivity type match each other, and wherein said fourth and fifth transistors of said second conductivity type match each other.

6. The gain stage of claim 1, wherein said first conductivity type comprises P-type and wherein said second conductivity type comprises N-type.

7. The gain stage of claim 1, wherein said second current level is seven times said first current level in which a current of three times said first current level flows through each of said second and third transistors of said second conductivity type and wherein a current of said first current level flows through said sixth transistor of said second conductivity type.

8. The gain stage of claim 1, wherein:
said second transistor of said second conductivity type has a first current terminal coupled to said reference supply voltage and has a second current terminal;
wherein said third transistor of said second conductivity type has a first current terminal coupled to said reference supply voltage and has a second current terminal; and
further comprising:
a first cascode transistor of said second conductivity type having a first current terminal coupled to said second current terminal of said second transistor of said second conductivity type, having a second current terminal coupled to said first output node, and having a control terminal coupled to said first bias node; and
a second cascode transistor of said second conductivity type having a first current terminal coupled to said second current terminal of said third transistor of said second conductivity type, having a second current terminal coupled to said second output node, and having a control terminal coupled to said first bias node.

9. The gain stage of claim 1, further comprising a clamp circuit coupled between said digital and reference supply voltages that clamps said first and second output nodes to a voltage range between said reference supply voltage and a limit voltage level that prevents said first and second transistors of said first conductivity type from entering a linear operating mode during switching.

10. The gain stage of claim 1, wherein:
said first current source comprises a third transistor of said first conductivity type having a first current terminal coupled to said digital supply voltage, having a second current terminal coupled to said first bias node, and having a control terminal coupled to a second bias node receiving a bias voltage; and
said second current source comprises a fourth transistor of said first conductivity type having a first current terminal coupled to said digital supply voltage, having a second current terminal coupled to said source node, and having a control terminal coupled to said second bias node.

11. The gain stage of claim 10, further comprising:
a fifth transistor of said first conductivity type having a first current terminal coupled to said digital supply voltage, having a second current terminal coupled to a first body node, and having a control terminal coupled to said second bias node;
a sixth transistor of said first conductivity type having a first current terminal and a body connection coupled together at said first body node, and having a second current terminal and a control terminal coupled together at a second body node;
a seventh transistor of said first conductivity type having a first current terminal coupled to said second body node, having a second current terminal and a control terminal coupled together at said reference supply voltage, and having a body connection coupled to said first body node; and
wherein said first and second transistors of said first conductivity type each have a body connection coupled to said first body node.

12. The gain stage of claim 11, further comprising a clamp circuit which comprises:
an eighth transistor of said first conductivity type having a first current terminal coupled to said second output node, having a second current terminal and a control terminal coupled together at said reference supply voltage, and having a body connection coupled to said second body node; and
a ninth transistor of said first conductivity type having a first current terminal coupled to said first output node, having a second current terminal and a control terminal coupled together at said reference supply voltage, and having a body connection coupled to said second body node.

13. The gain stage of claim 12, wherein:
said second transistor of said second conductivity type has a first current terminal coupled to said reference supply voltage and has a second current terminal;
wherein said third transistor of said second conductivity type has a first current terminal coupled to said reference supply voltage and has a second current terminal; and
further comprising:
a first cascode transistor of said second conductivity type having a first current terminal coupled to said second current terminal of said second transistor of said second conductivity type, having a second current terminal coupled to said first output node, and having a control terminal coupled to said first bias node; and
a second cascode transistor of said second conductivity type having a first current terminal coupled to said second current terminal of said third transistor of said second conductivity type, having a second current terminal coupled to said second output node, and having a control terminal coupled to said first bias node.

14. A comparator, comprising:
an input amplifier coupled between an analog supply voltage and a reference supply voltage that amplifies a difference between first and second analog input voltages and provides first and second analog output voltages; and
a comparator gain stage coupled between a digital supply voltage and said reference supply voltage, comprising:
a first current source having an input coupled to said digital supply voltage and having an output providing a first current level to a first bias node;
a second current source having an input coupled to said digital supply voltage and having an output providing a second current level to a source node;
a first transistor of a first conductivity type having current terminals coupled between said source node and a first output node, and having a control terminal coupled to receive said first analog output voltage;
a second transistor of said first conductivity type having current terminals coupled between said source node and a second output node, and having a control terminal coupled to receive said second analog output voltage;
a first transistor of a second conductivity type having current terminals coupled between said first bias node and said reference supply voltage, and having a control terminal coupled to said first bias node;
a second transistor of said second conductivity type having current terminals coupled between said first output node and said reference supply voltage, and having a control terminal coupled to said first bias node;
a third transistor of said second conductivity type having current terminals coupled between said second output node and said reference supply voltage, and having a control terminal coupled to said first bias node;

a fourth transistor of said second conductivity type having current terminals coupled between said second output node and a common node, and having a control terminal coupled to said first output node;

a fifth transistor of said second conductivity type having current terminals coupled between said first output node and said common node, and having a control terminal coupled to said second output node; and a sixth transistor of said second conductivity type having current terminals coupled between said common node and said reference supply voltage, and having a control terminal coupled to said first bias node.

15. The comparator of claim 14, further comprising a logic circuit having an input coupled to said first and second output nodes and an output providing drive signals to a complementary pair of MOS transistors, wherein said digital supply voltage is sufficiently low to prevent said first and second transistors of said first conductivity type from entering a linear operating mode during switching.

16. The comparator of claim 14, further comprising:
a clamp circuit coupled between said digital supply voltage and said reference supply voltage that clamps said first and second output nodes to a voltage range between said reference supply voltage and a limit voltage level that is less than said digital supply voltage, wherein said limit voltage level prevents said first and second transistors of said first conductivity type from entering a linear operating mode;

a level translator coupled between said digital supply voltage and said reference supply voltage, having an input coupled to said first and second output nodes and having a differential digital output including a positive polarity and a negative polarity; and a logic circuit having an input coupled to said positive and negative polarities of said differential digital output of said level translator and having an output providing drive signals to a complementary pair of MOS transistors.

17. The comparator of claim 14, wherein said first and second transistors of said first conductivity type match each other, wherein said first, second and third transistors of said second conductivity type match each other, and wherein said fourth and fifth transistors of said second conductivity type match each other.

18. The comparator of claim 14, further comprising:
said first current source comprising a third transistor of said first conductivity type having a first current terminal coupled to said digital supply voltage, having a second current terminal coupled to said first bias node, and having a control terminal coupled to a second bias node receiving a bias voltage;

said second current source comprising a fourth transistor of said first conductivity type having a first current terminal coupled to said digital supply voltage, having a second current terminal coupled to said source node, and having a control terminal coupled to said second bias node;

a fifth transistor of said first conductivity type having a first current terminal coupled to said digital supply voltage, having a second current terminal coupled to a first body node, and having a control terminal coupled to said second bias node;

a sixth transistor of said first conductivity type having a first current terminal and a body connection coupled together at said first body node, and having a second current terminal and a control terminal coupled together at a second body node;

a seventh transistor of said first conductivity type having a first current terminal coupled to said second body node, having a second current terminal and a control terminal coupled together at said reference supply voltage, and having a body connection coupled to said first body node; and wherein said first and second transistors of said first conductivity type each have a body connection coupled to said first body node.

19. The comparator of claim 18, further comprising a clamp circuit which comprises:
an eighth transistor of said first conductivity type having a first current terminal coupled to said second output node, having a second current terminal and a control terminal coupled together at said reference supply voltage, and having a body connection coupled to said second body node; and a ninth transistor of said first conductivity type having a first current terminal coupled to said first output node, having a second current terminal and a control terminal coupled together at said reference supply voltage, and having a body connection coupled to said second body node.

20. The comparator of claim 19, wherein:
said second transistor of said second conductivity type has a first current terminal coupled to said reference supply voltage and has a second current terminal;

wherein said third transistor of said second conductivity type has a first current terminal coupled to said reference supply voltage and has a second current terminal; and further comprising:
a first cascode transistor of said second conductivity type having a first current terminal coupled to said second current terminal of said second transistor of said second conductivity type, having a second current terminal coupled to said first output node, and having a control terminal coupled to said first bias node; and a second cascode transistor of said second conductivity type having a first current terminal coupled to said second current terminal of said third transistor of said second conductivity type, having a second current terminal coupled to said second output node, and having a control terminal coupled to said first bias node.

* * * * *